United States Patent [19]
Fujima

[11] Patent Number: 5,821,808
[45] Date of Patent: Oct. 13, 1998

[54] VOLTAGE CIRCUIT FOR PREVENTING VOLTAGE FLUCTUATION

[75] Inventor: Shiro Fujima, Tokyo, Japan

[73] Assignee: NEC Corporation, Tokyo, Japan

[21] Appl. No.: 691,395

[22] Filed: Aug. 2, 1996

[30] Foreign Application Priority Data

Aug. 25, 1995 [JP] Japan .................................. 7-240903

[51] Int. Cl.⁶ .................................................. G05F 1/10
[52] U.S. Cl. ........................... 327/541; 327/540; 327/87; 327/538; 365/226
[58] Field of Search .................................... 327/530, 538, 327/539, 540, 541, 543, 54, 73, 87; 365/226, 227; 326/80, 81, 63, 68

[56] References Cited

U.S. PATENT DOCUMENTS

| 5,121,007 | 6/1992 | Aizaki | 326/80 |
| 5,132,565 | 7/1992 | Kuzomoto | 327/142 |
| 5,442,277 | 8/1995 | Mori et al. | 327/530 |
| 5,627,493 | 5/1997 | Takeuchi et al. | 327/535 |

FOREIGN PATENT DOCUMENTS

| 63-211414 | 9/1988 | Japan . |
| 1-161513 | 6/1989 | Japan . |
| 5-334879 | 12/1993 | Japan . |
| 6-295211 | 10/1994 | Japan . |

Primary Examiner—Timothy P. Callahan
Assistant Examiner—Jung Ho Kim
Attorney, Agent, or Firm—Young & Thompson

[57] ABSTRACT

A voltage circuit for a device having an active period and an inactive period comprises a reference voltage generator generating a reference voltage and a voltage stabilizer receiving the reference voltage. The voltage stabilizer includes first circuit componentry for raising a potential of an output terminal during the active period of the device and second circuit componentry for lowering a potential of the output terminal during at least the inactive period of the device.

15 Claims, 6 Drawing Sheets

VOLTAGE CIRCUIT FOR PREVENTING VOLTAGE FLUCTUATION

BACKGROUND OF THE INVENTION

1. Field of the Invention

The present invention relates to a voltage circuit, and particularly to a voltage circuit for a device having an active period and an inactive period, such as a dynamic random access memory (DRAM).

2. Description of the Related Art

The voltage supplied to an internal circuit such as a DRAM is generated by a reference voltage circuit to assure a correct operation of the internal circuit.

FIG. 8 shows a DRAM 100 as an internal circuit and a reference voltage circuit including a reference voltage source 101, a comparator 102 and a P-channel MOS transistor 103. The reference voltage source 101 supplies a reference voltage V1 to the inverting input (−) of the comparator 102, which compares the reference voltage V1 with an internal voltage V2 supplied to a non-inverting input (+) thereof to control the transistor 103 connected to the output of the comparator 102. The DRAM 100 is driven by a voltage between the internal voltage V2 and a ground voltage.

Next, an operation of the reference voltage circuit shown in FIG. 8 will be explained. The reference voltage circuit operates to stabilize a potential of the internal voltage V2 during an operating period of the DRAM 100. This is, when the potential of the internal voltage V2 is lowered from an original potential which is required by the DRAM 100 based on the power consumption of the DRAM 100, the comparator 102 detects this and lowers a potential at its output. Thus, the transistor 103 supplies the DRAM 100 with higher potential as the internal voltage V2 because a potential of the gate electrode of the transistor 103 is lowered. The internal voltage V2 therefore resumes the original potential.

On the other hand, when the potential of the internal voltage V2 becomes high compared to the original potential, the comparator 102 detects this and increase the potential at its output. Thus, the transistor 103 is in the cut-off state and the potential of the internal voltage V2 is lowered based on the power consumption of the DRAM 100. The internal voltage V2 therefore resumes the original potential.

However, since the reference voltage circuit shown in FIG. 8 has a high driving ability and a quick response ability to stabilize the internal voltage V2 during the active state of the DRAM 1, an overshoot occurs in the internal voltage V2 by reaction at the time when it is restored to its original level. This overshoot is eliminated by the power consumption of the DRAM 100 during operation. However, the overshoot is not eliminated when DRAM 100 consumes little power from the internal voltage V2, i.e., when DRAM 100 is inactive at the time the overshoot occurs.

In this case, the overshoot is maintained until the DRAM 100 is activated and consumes power from the internal voltage V2 again. That is, the internal voltage V2 has an incorrect potential at the time when the DRAM 100 is activated again. Therefore, the reference voltage circuit shown in FIG. 8 has a problem that the internal circuit such as DRAM 100 operates incorrectly when the DRAM 100 is activated again.

SUMMARY OF THE INVENTION

It is therefore an object of the present invention to provide an improved voltage circuit for a device having an active period and an inactive period.

It is another object of the present invention to provide a voltage circuit supplying a stabilized voltage to a device during both of an active and an inactive period of the device.

It is a further object of the present invention to provide a voltage circuit recovering an overshoot of an internal voltage during an inactive state of a device supplied with the internal voltage.

It is a still further object of the present invention to provide a voltage circuit supplying an internal voltage to a device and recovering an overshoot of the internal voltage rapidly during an active state of the device, and supplying the internal voltage to the device with little power consumption during an inactive state of the device.

A voltage circuit according to the present invention includes a circuit which lowers a potential of an internal voltage supplied to a device during an inactive period of the device. More specifically, a voltage circuit according to one aspect of the present invention includes a first means for raising a potential of an internal voltage supplied to a device during an active period of the device and a second means for lowering the potential of the internal voltage during at least the inactive period of the device.

Thus, an overshoot occurring at the time when the device is inactive may be avoided, so that correct operation of the internal circuit is assured.

BRIEF DESCRIPTION OF THE DRAWINGS

The above and other objects, features and advantages of the present invention will be apparent from the following detailed description of preferred embodiments of the present invention taken in conjunction with the accompanying drawings, in which.

DETAILED DESCRIPTION OF THE PREFERRED EMBODIMENTS

Figure 1:
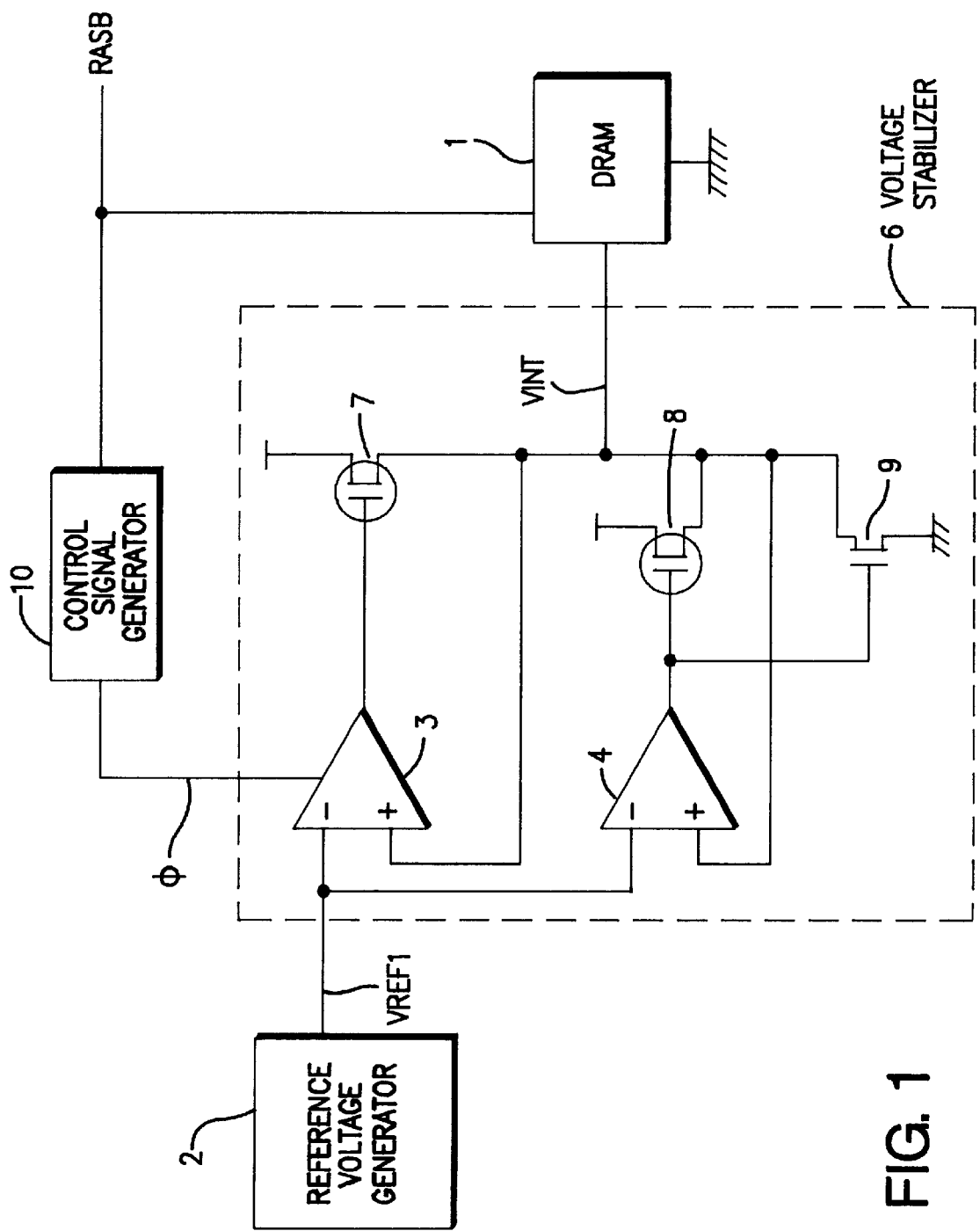
FIG. 1 is a schematic diagram of a voltage circuit according to a first embodiment of the present invention.

Referring to FIG. 1, a voltage circuit according to the first embodiment of the present invention comprises a reference voltage generator 2 generating a reference voltage VREF1 and a voltage stabilizer 6 supplied with the reference voltage VREF1 and generating an internal voltage VINT. The voltage stabilizer 6 comprises comparators 3 and 4, P-channel MOS transistors 7 and 8 and one N-channel MOS transistor 9. A gate electrode of the transistor 7 is connected to the output of comparator 3 and both gate electrodes of the transistors 8 and 9 are connected to the output of comparator 4. Both source electrodes of transistors 7 and 8 are connected to a voltage supply terminal (Vcc), and a source electrode of the transistor 9 is connected to a ground terminal (GND).

Each inverting input (−) of the comparators 3 and 4 is supplied in common with the reference voltage VREF1, and each non-inverting input (+) of the comparators 3 and 4 is supplied in common with the internal voltage VINT. The internal voltage VINT is supplied to a DRAM 1 which is driven by a voltage whose value is intermediate the internal voltage VINT and a ground voltage. The DRAM 1 is activated in response to a low level of a strobe signal RASB and inactivated in response to a high level of the strobe signal RASB. The strobe signal RASB is also supplied to a control signal generator 10 which inverts the strobe signal RASB to generate a control signal φ.

Figure 2:
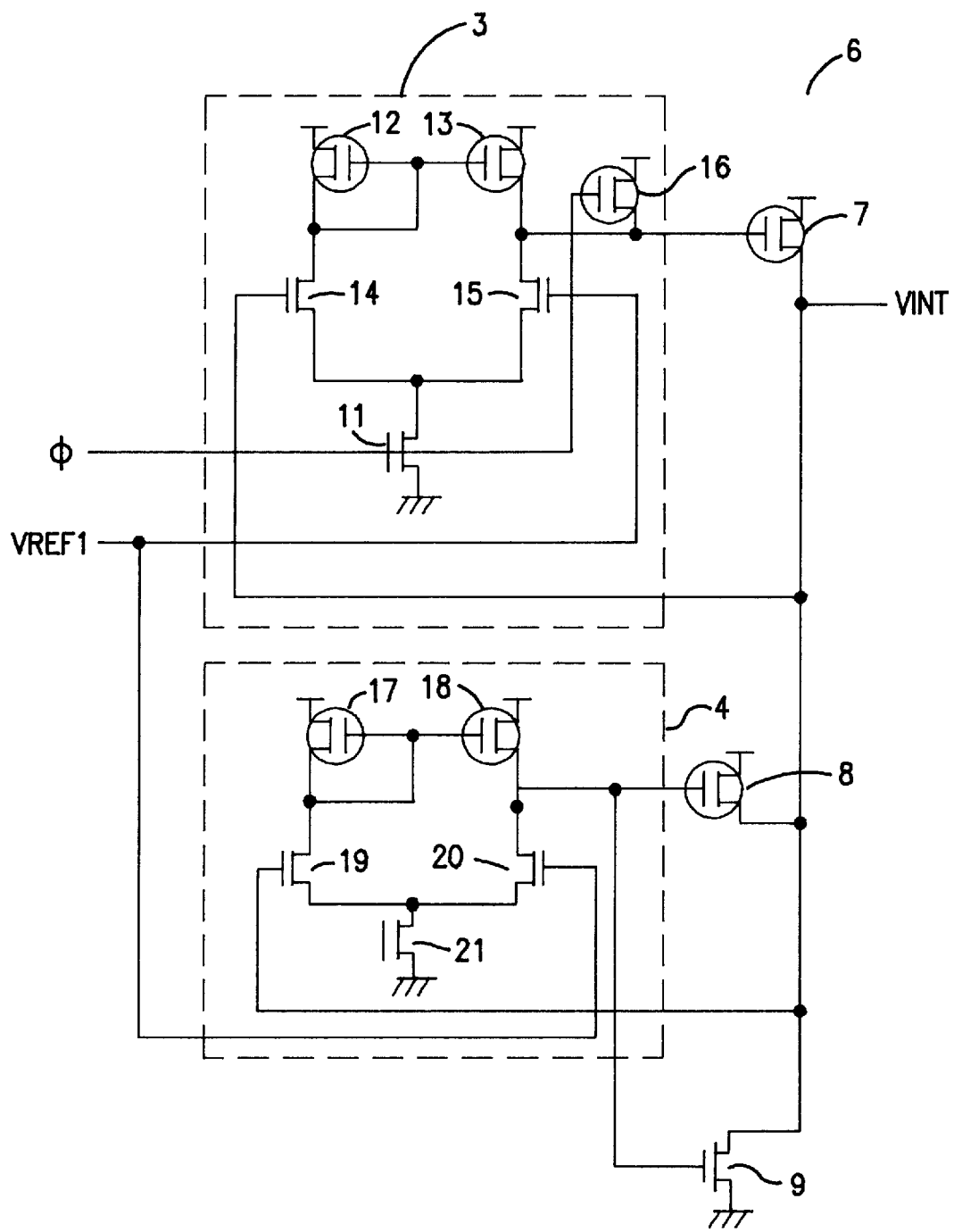
FIG. 2 is a circuit diagram of the voltage stabilizer shown in FIG. 1.

Turning to FIG. 2, each of the comparators 3 and 4 is constituted of a differential amplifier. That is, each of the comparators 3 and 4 comprises MOS transistors 11–16 and 17–21, respectively. Each of the transistors 11 and 16 in the comparator 3 is controlled by the control signal φ. That is, when the control signal φ takes high level, the transistor 11 is in a conductive state to activate the comparator 3 and the transistor 16 is in a cut-off state to activate the transistor 7. On the other hand, when the control signal φ takes low level, the transistor 11 is in the cut-off state to inactivate the comparator 3 and the transistor 16 is in the conductive state so that the transistor 7 is in the cut-off state. In contrast, the comparator 4 is in the active state regardless of the level of the control signal φ.

The transistors 8 and 9 have the same transistor size as each other, but the transistor 7 in this embodiment preferably has a transistor size twenty times larger than the transistor 8 or 9. For example, the transistor 7 has a gate width of 2,000μ, then each of the transistors 8 and 9 has a gate width of 100μ. Each of the transistors 11–16 constituting the comparator 3 also has a transistor size twenty times larger than each of the transistors 17–21 constituting the comparator 4.

The operation of the voltage circuit according to the first embodiment will now be explained referring to FIGS. 1, 2 and 5.

First, when the strobe signal RASB goes high, both of the DRAM 1 and the comparator 3 are in the inactive state, so that the DRAM 1 consumes little power from the internal voltage VINT. In this time, the internal voltage VINT is maintained at the same potential as the reference voltage VREF1 because the comparator 4 and the transistors 8 and 9 are connected as a negative feedback loop to maintain the potential of the internal voltage VINT. Since each of the transistors 17–21 constituting the comparator 4 and the transistors 8 and 9 has a relatively small transistor size, these transistors are restrained from high power consumption to maintain the potential of the internal voltage VINT.

In response to a change of the strobe signal RASB to low level from high level, The DRAM 1 is activated and the control signal generator 10 generates the control signal φ of high level to activate the comparator 3. Thus, the internal voltage VINT is lowered based on the operation of the DRAM 1, as a drop 40 shown in FIG. 6.

Figure 6:
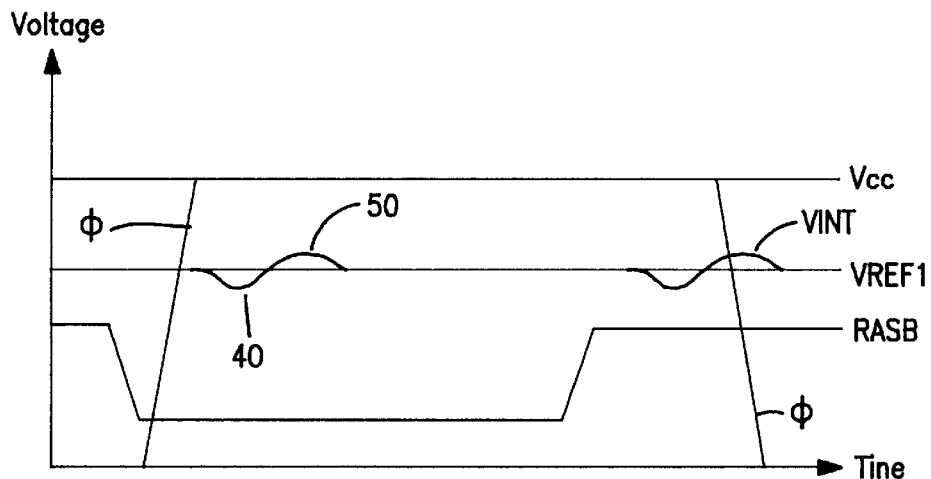
FIG. 6 is a timing chart that explains the operation of the voltage circuit according to the first embodiment of the present invention.

In response to the drop 40 of the internal voltage VINT, each of the output voltages of the comparators 3 and 4 is lowered. Thus, the potential of internal voltage VINT quickly recovers to the original potential which is the same potential as the reference voltage VREF1, because the transistor 7 has a high driving ability and a quick response ability to stabilize the internal voltage VINT. However, due to the high driving ability and the quick response ability of the transistor 7, an overshoot 50 occurs in the internal voltage VINT, as shown in FIG. 6. The internal voltage VINT having a overshoot 50 is automatically recovered and stabilized because the DRAM 1 consumes power from the internal voltage VINT. Thus, the internal voltage VINT is stabilized during the active period of the DRAM 1.

Thereafter, when the strobe signal RASB changes from low level to high level, the DRAM 1 is inactivated again and the control signal generator 10 generates the control signal φ of low level to inactivate the comparator 3. While the strobe signal RASB at high level, the internal voltage VINT is again maintained at the same potential as the reference voltage VREF1 by the comparator 4 and the transistors 8 and 9.

As shown in FIG. 6, if the strobe signal RASB changes to high level around the time when the internal voltage VINT drops, it is possible that the DRAM 1 has been already inactivated during a period of the overshoot. In other words, it is possible that the DRAM 1 becomes inactive when the internal voltage VINT overshoots. In this case, although this overshoot is not recovered by the power consumption of the DRAM 1 so that the DRAM 1 consumes little power from the internal voltage VINT, the overshoot is recovered by the transistor 9 and the comparator 4 which is in the active state regardless of the level of the strobe signal RASB or the control signal φ.

On the contrary, if the DRAM 1 becomes inactive just as the internal voltage VINT drops, since the comparator 3 has been already inactivated, this drop is not recovered by the comparator 3 and the transistor 7. However, the drop is recovered by the transistor 8 and the comparator 4 which is in the active state regardless of the level of the strobe signal RASB or the control signal φ.

As described above, according to the first embodiment of the present invention, while the DRAM 1 is in the active state, the potential of the internal voltage VINT is maintained at the same potential as the reference voltage VREF1 by the comparator 3 and transistor 7 which has high driving ability and quick response ability. Therefore, the correct operation of the DRAM 1 is assured during the active state. On the other hand, while the DRAM 1 is in the inactive state, the potential of the internal voltage VINT is also maintained at the same potential as the reference voltage VREF1 by the comparator 4 and the transistors 8 and 9, each of which is in the active state and has a small transistor size. Therefore, the correct operation of the DRAM 1 is also assured at the time when the DRAM 1 is activated again.

Moreover, since each of the transistor 7 and transistors 11–16 constituting the comparator 3 has a relatively large transistor size, a drop or an overshoot in the internal voltage VINT is quickly recovered. Furthermore, since the comparator 3 is inactivated while the DRAM 1 is inactive and each of the transistor size of the transistors constituting the comparator 4 and the transistor 8 and 9 is relatively small, power consumption is lowered during the inactive state of the DRAM 1.

Figure 3:
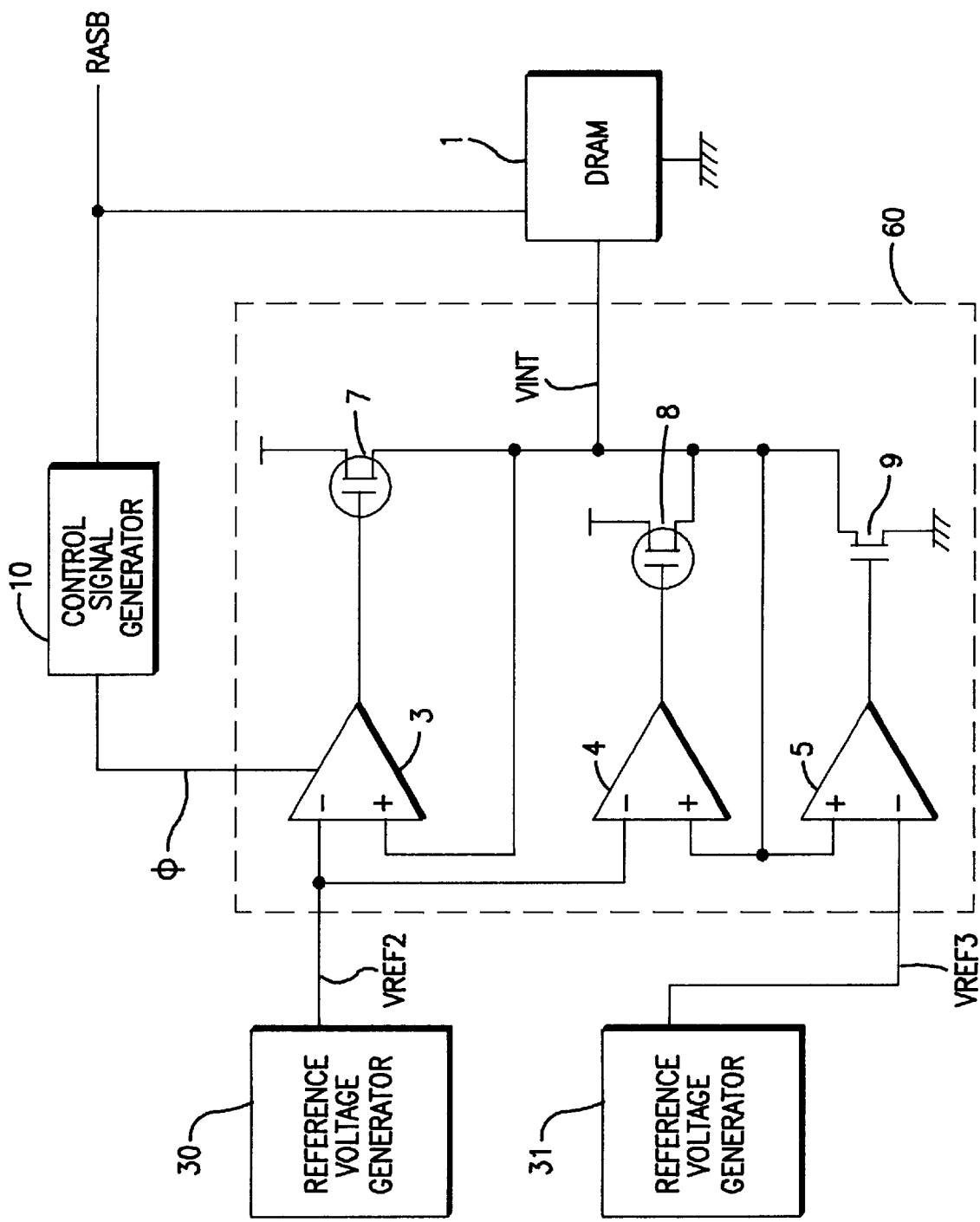
FIG. 3 is a schematic diagram of a voltage circuit according to a second embodiment of the present invention.
Figure 4:
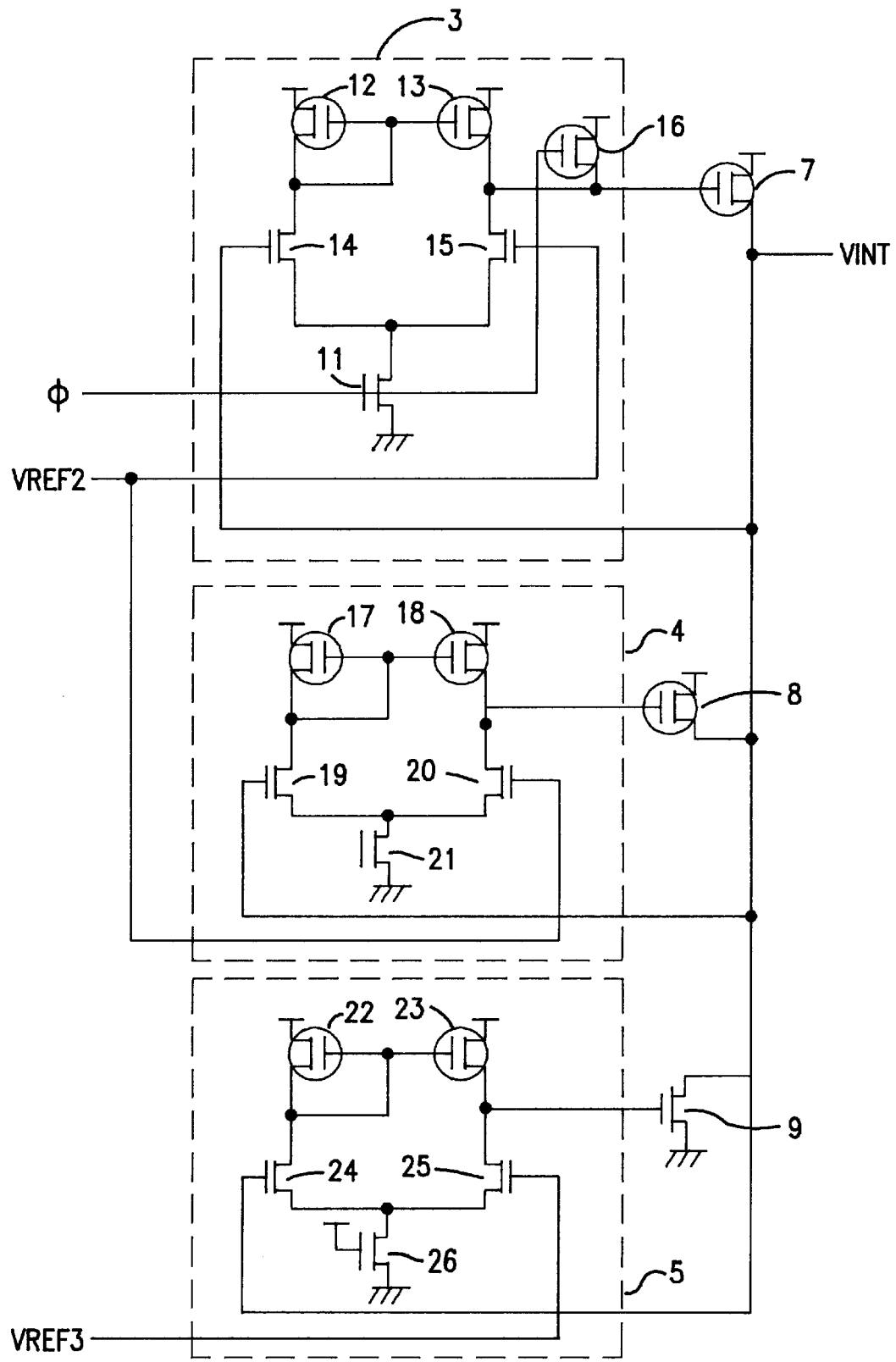
FIG. 4 is a circuit diagram of the voltage stabilizer shown in FIG. 3.

Next, referring to FIG. 3, a voltage circuit according to the second embodiment of the present invention will be explained.

The voltage circuit according to the second embodiment differs from the first embodiment in that each of the inverting inputs (−) of the comparators 3 and 4 is supplied with a reference voltage VREF2 from a reference voltage generator 30, a comparator 5 having an inverting input (−) supplied with a reference voltage VREF3 form a reference voltage generator 31 and a non-inverting input (+) supplied with the internal voltage VINT is added, and the gate electrode of the transistor 9 is connected to the output of the comparator 5. The construction of the voltage circuit according to the second embodiment is otherwise the same as the voltage circuit of the first embodiment.

Figure 7:
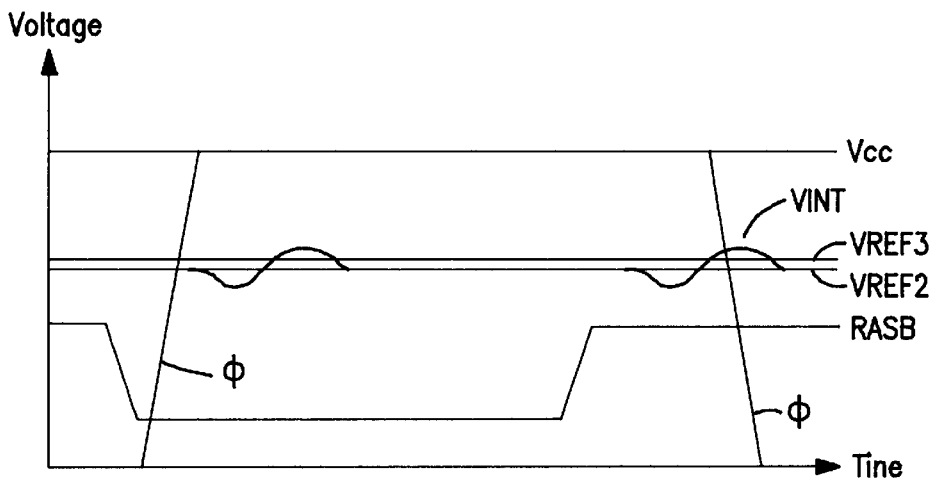
FIG. 7 is a timing chart that explains the operation of the voltage circuit according to the second and third embodiments of the present invention.
Figure 8:
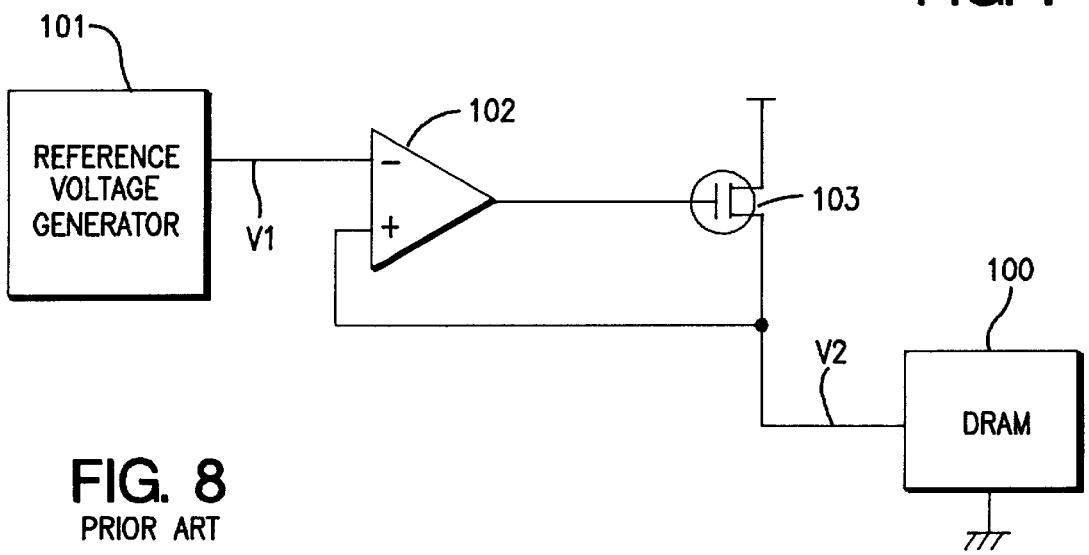
FIG. 8 is a schematic diagram of a conventional reference voltage circuit.

As shown in FIG. 7, a potential of the reference voltage VREF3 is set to a potential which is a little higher than a potential of the reference voltage VREF2. Preferably, the potential of the reference voltage VREF2 is set to the potential of the reference voltage VREF1 explained in the first embodiment.

In the voltage circuit according to this embodiment, the potential of the internal voltage is stabilized more accurately because in the normal state, i.e., in the state of no overshoot in the internal voltage VINT, the non-inverting input (+) of the comparator 5 receives a potential of the internal voltage VINT which is substantially the same potential as the reference voltage VREF2, so that the transistor 9 is in the cut-off state. In other words, the transistor 9 becomes conductive only when overshoot occurs in the internal voltage VINT, so that the potential of the internal voltage VINT is stabilized accurately.

Moreover, according to the voltage circuit of the second embodiment, power consumption is reduced because current through the transistors 7–9 is lowered.

Figure 5:
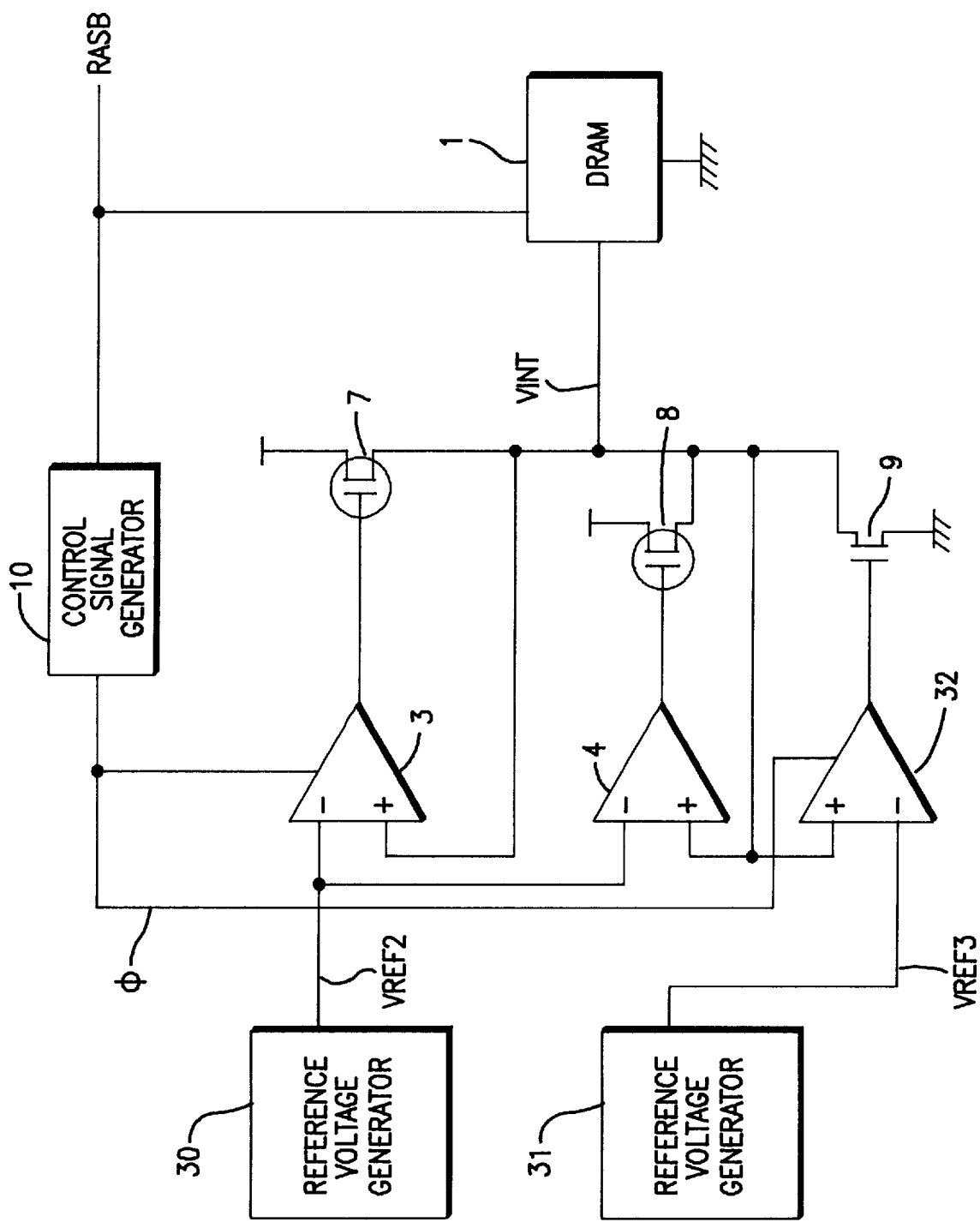
FIG. 5 is a schematic diagram of a voltage circuit according to a third embodiment of the present invention.

Referring to FIG. 5, a voltage circuit according to the third embodiment of the present invention will be explained.

The voltage circuit according to the third embodiment differs from the second embodiment in that the comparator 5 is replaced with a comparator 32 which is also supplied with the control signal φ. The construction of the voltage circuit according to the third embodiment is otherwise the same as the voltage circuit of the second embodiment.

As shown in FIG. 5, an inverting input (−) of the comparator 32 is supplied with the reference voltage VREF3 and a non-inverting input (+) of the comparator 32 is supplied with the internal voltage VINT similar to the comparator 5. The comparator 32 is activated to drive the transistor 9 in response to the low level of the control signal φ and inactivated to effect cut-off of the transistor 9 in response to the high level of the control signal φ.

According to the voltage circuit of this embodiment, power consumption of the voltage circuit is further reduced because the current path through the transistors 7–9 is cut off during the active period of the DRAM 1.

It is apparent that the present invention is not limited to the above embodiments but may be changed and modified without departing from the scope and spirit of the invention.

What is claimed is:

1. A voltage circuit having first and second input terminals, an output terminal and first and second power terminals comprising:
   a first comparator having a first input connected to said first input terminal, a second input connected to said output terminal and a first output;
   a second comparator having a third input connected to said second input terminal, a fourth input connected to said output terminal and a second output;
   a first transistor connected between said output terminal and said first power terminal, said first transistor having a gate electrode connected to said first output; and
   a second transistor connected between said output terminal and said second power terminal, said second transistor having a gate electrode connected to said second output.

2. The voltage circuit as claimed in claim 1, wherein said first input terminal is supplied with a first reference voltage, and said second input terminal is supplied with a second reference voltage different from said first reference voltage.

3. The voltage circuit as claimed in claim 2 further comprising:
   a third comparator having a fifth input connected to said first input terminal, a sixth input connected to said output terminal and a third output;
   a third transistor connected between said output terminal and said first power terminal, said third transistor having a gate electrode connected to said third output.

4. The voltage circuit as claimed in claim 3, wherein said output terminal is connected to a device activated in response to a strobe signal, said device being driven by a voltage between said output terminal and said second power terminal, said first comparator being activated in response to said strobe signal.

5. The voltage circuit as claimed in claim 4, wherein said second comparator is inactivated in response to said strobe signal.

6. The voltage circuit as claimed in claim 5, wherein said device is a DRAM.

7. The voltage circuit as claimed in claim 1, wherein said first transistor has a first gate width, and said second transistor has a second gate width smaller than said first gate width.

8. The voltage circuit as claimed in claim 3, wherein said first transistor has a first gate width, said second transistor having a second gate width smaller than said first gate width, said third transistor having a third gate width smaller than said first gate width.

9. A voltage circuit comprising a first reference voltage generator supplying a first reference voltage to a first reference terminal and a voltage stabilizer including first and second negative feedback loops, each of which is connected between said first reference terminal and an output terminal to prevent said output terminal from having a potential lower than said first reference voltage, said first negative feedback loop having a first driving capacity, said second negative feedback loop having a second driving capacity smaller than said first driving capacity, and a third negative feedback loop connected between said first reference terminal and said output terminal to prevent said output terminal from having a potential higher than said first reference voltage, said third negative feedback loop having a third driving capacity smaller than said first driving capacity.

10. A voltage circuit comprising a first reference voltage generator supplying a first reference voltage to a first reference terminal and a voltage stabilizer including first and second negative feedback loops, each of which is connected between said first reference terminal and an output terminal to prevent said output terminal from having a potential lower than said first reference voltage, said first negative feedback loop having a first driving capacity, said second negative feedback loop having a second driving capacity smaller than said first driving capacity, and a second reference voltage generator supplying a second reference voltage different from said first reference voltage to a second reference terminal, wherein said voltage stabilizer further includes a third negative feedback loop connected between said second reference terminal and said output terminal to prevent said output terminal from having a potential higher than said second reference voltage.

11. The voltage circuit as claimed in claim 10, wherein said first reference voltage is lower than said second reference voltage.

12. The voltage circuit as claimed in claim 11, wherein said third negative feedback loop has a third driving capacity smaller than said first driving capacity.

13. The voltage circuit as claimed in claim 12, wherein said voltage stabilizer is supplied with a control signal taking one of first and second levels, said first level of said control signal activating said first negative feedback loop and inactivating said third negative feedback loop, said second level of said control signal inactivating said first negative feedback loop and activating said third negative feedback loop.

14. A voltage circuit for stabilizing a voltage on a voltage line, comprising:

a comparator having a first input node supplied with said voltage on said voltage line, a second input node supplied with a reference voltage, and an output node;

first and second power lines;

a first transistor coupled between said voltage line and said first power line and having a control electrode coupled to said output node of said comparator; and a second transistor coupled between said voltage line and said second power line and having a control electrode coupled to said output node of said comparator.

15. The circuit as claimed in claim 14, wherein said first transistor is of a first channel type and said second transistor is of a second channel type opposite to said first channel type so that said first and second transistors are controlled in a complementary manner by said comparator.

* * * * *